United States Patent [19]
Tabet et al.

[11] Patent Number: 5,983,183
[45] Date of Patent: Nov. 9, 1999

[54] AUDIO AUTOMATIC GAIN CONTROL SYSTEM

[75] Inventors: Jad Tabet, Paris, France; Yonik Breton, Montreal, Canada

[73] Assignee: General Data Comm, Inc., Middlebury, Conn.

[21] Appl. No.: 08/888,571

[22] Filed: Jul. 7, 1997

[51] Int. Cl.⁶ .................................................. G10L 5/00
[52] U.S. Cl. .......................... 704/270; 381/108; 381/94.3
[58] Field of Search .................................... 381/107, 108, 381/94.3; 704/233, 270; 395/200.34; 379/202; 348/15, 16; 370/260

[56] References Cited

U.S. PATENT DOCUMENTS

| | | | |
|---|---|---|---|
| 4,558,180 | 12/1985 | Scordo | 179/18 |
| 4,716,585 | 12/1987 | Tompkins et al. | 379/202 |
| 4,794,343 | 12/1988 | Yang | 330/2 |
| 4,937,859 | 6/1990 | Natarajan | 379/158 |
| 5,130,665 | 7/1992 | Walden | 381/107 |
| 5,291,558 | 3/1994 | Ross | 381/107 |
| 5,297,198 | 3/1994 | Butani et al. | 379/389 |
| 5,297,210 | 3/1994 | Julstrom | 381/66 |
| 5,307,441 | 4/1994 | Tzeng | 395/2.31 |
| 5,369,711 | 11/1994 | Williamson, III | 381/107 |
| 5,404,397 | 4/1995 | Janse et al. | 379/206 |
| 5,436,896 | 7/1995 | Anderson et al. | 370/62 |
| 5,523,875 | 6/1996 | Morris | 359/194 |
| 5,533,112 | 7/1996 | Danneels | 379/202 |
| 5,649,055 | 7/1997 | Gupta et al. | 704/214 |
| 5,706,394 | 1/1998 | Wynn | 704/226 |

*Primary Examiner*—Curtis A. Kuntz
*Assistant Examiner*—M. David Sofocleous
*Attorney, Agent, or Firm*—David P. Gordon; David S. Jacobson; Thomas A. Gallagher

[57] ABSTRACT

An automatic gain control (AGC) algorithm is provided to the digital signal processor instructions of an audio processing unit of a multimedia multipoint server. The AGC algorithm operates to bring the power level of the audio signal of every active channel to within a fixed range. The AGC algorithm allows the use of non-calibrated microphones, corrects for long distance signal attenuation, and provides improved audio level reference for audio switching and audio level video switching. The AGC algorithm is structured into two steps: calibration and gain control. The calibration includes defining a noise threshold. Gain control includes first calculating a dynamic speech detection level. Second, with reference to the speech detection level, determining whether an incoming audio signal is a speech-based audio signal. Finally, when the audio signal is determined to be of speech, calculating a smoothed power estimation of the speech signal, and appropriately updating the gain on each channel so that the power level of the speech signal is moved toward or confined within the fixed experimental range.

20 Claims, 4 Drawing Sheets

000
AUDIO AUTOMATIC GAIN CONTROL SYSTEM

BACKGROUND OF THE INVENTION

1. Field of the Invention

This invention relates broadly to telecommunications equipment. More particularly, this invention relates to a system which performs automatic gain control on the audio channels of multimedia telecommunications equipment.

2. State of the Art

With the increase of throughput (data rate) available in the telecommunications industry, and in association with the improvement of compression and decompression algorithms, the number of telecommunication applications available to individuals and businesses has increased dramatically. One of these applications is called "multimedia communications" which permits video, audio, and in some cases other data to be transported from one party to another or others. Multimedia communications can be utilized for a number of applications, and in different configurations. One configuration of recent interest has been multimedia conferencing, where several parties can communicate in a conference style.

In multimedia conferencing, the audio and video data is handled such that each party can see and hear one, several, or all of the other parties. In fact, various telecommunications recommendations and standards are presently being adopted by the ITU-T, ISO, and Bellcore which govern the protocols of multimedia conferencing (see, e.g., ITU-T T.120). In the multimedia conferencing systems of the art (as represented by prior art FIG. 1), the audio, video, and other data streams generated by a user's system 12a are multiplexed together directly in the encoder section of a multimedia encoder/decoder (codec) 14 located at the source/terminal 16, and transported together through the transport network 20 (now proposed in ATM format) to a similar "peer" codec at a remote location. The peer codec is either another codec 14 at the remote user site for a point-to-point conference, and/or a codec/switch 24 at a multimedia bridge 26 (also called a multimedia multipoint server or MMS) for a multipoint conference. The MMS 26, which typically includes a codec/switch 24, a controller 28, an audio processing unit (APU) 30, and a video processing unit (VPU) 31, provides conference control (e.g., it determines the signal to be sent to each participant), audio mixing (bridging) and multicasting, audio level detection for conference control, audio level switching, video mixing (e.g., a quad split, or "continuous presence device" which combines multiple images for display together) when available and/or desirable, and video multicasting. Specifically, the audio processing unit (APU) 30 controls the audio level detection for audio mixing, audio multicasting, and voice activated video switching. The audio and video data exiting the MMS are multiplexed, and continue through the transport network 20 to the desired multimedia source terminals 12b, 12c.

Figures 1, 5:
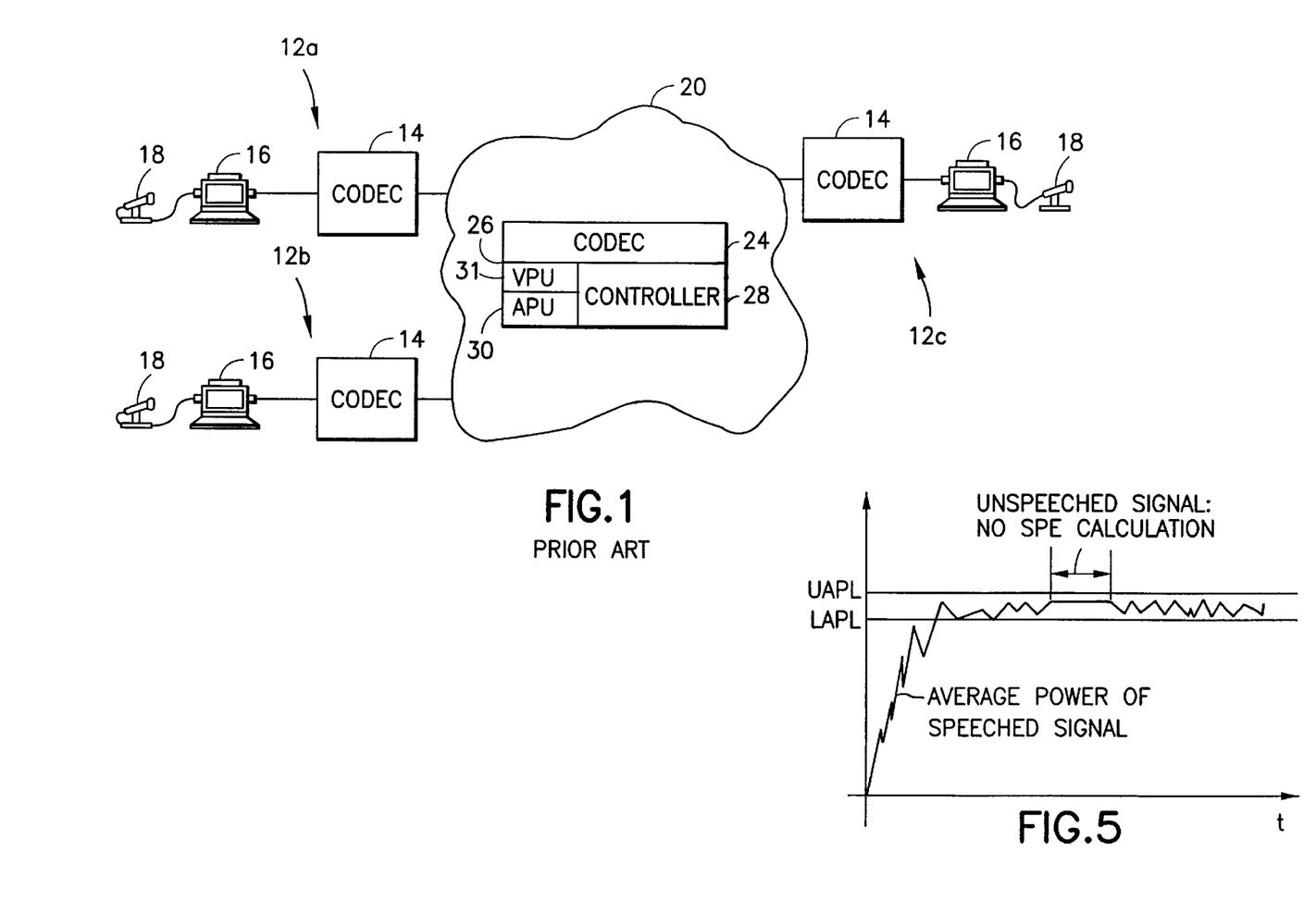
FIG. 1 is a representation of a multimedia conferencing system of the prior art, including a telecommunications network and a multimedia multipoint server.
FIG. 5 is a graph illustrating the gain updating function of the automatic gain control algorithm of the invention on an audio signal.

As stated above, multimedia systems are often provided with voice activated video switching. Voice activated video switching operates to display on a monitor a particular video signal based upon the power level of a speech-based audio signal multiplexed with the video signal. When a source provides an audio signal having a higher power level than the currently active signal, the APU 30 of the controller 28 automatically switches which video signal is displayed at the other terminals. As a result, the party speaking loudest typically has his or her image displayed on the monitor at the other terminals.

While, audio level, or voice activated, video switching is commonplace in the art, it suffers from several problems. First, audio signals from different sources do not share a common reference power level and, as such, the voice activated switching can be prevented from correctly switching to the appropriate party. Second, the power level of a channel varies according to several factors including signal attenuation due to analog transport losses (caused by the distance between a source terminal, i.e., a microphone, and its digital encoding station), and microphone sensitivity. Thus, switching based on an audio level received at the switch can be flawed due to power level variation. Third, the APU 30 of the multimedia bridge 26 is typically provided with a channel selection system which compares the power level of each of the channels joined in a multimedia teleconference with an experimental threshold power level. When the power level of a channel exceeds the threshold power level for a period of time (e.g., for greater than three seconds) and exceeds the power level of all of the other channels, then that channel is selected as the "loudest speaker" and the other parties to the teleconference in voice activated video switching mode receive the video associated with that loudest speaker. However, a problem occurs when the noise on one or more channels is particularly high, i.e., higher than the threshold power level. In such a case, the channel selection system is prevented from correctly selecting the appropriate channel, as the noisiest channel will always be the selected channel. As a result, it is evident that the power level of an audio channel by itself is not a reliable enough value on which to identify the loudest speaker.

Microphone calibration has been used to attempt to reduce the effect of differing microphone sensitivity. Calibrated microphones do generally provide a more consistent power level on the several channels. However, calibration should be done using the actual circuit connecting each microphone to the MMS so that a predetermined audio signal cue reaches the MMS at a given power level. This process is laborious and error prone. Depending on the technicians performing the calibrations, some microphones may be calibrated to a different sensitivity than others, failing to even adequately correct for the portion of unreliability rooted in the microphones.

SUMMARY OF THE INVENTION

It is therefore an object of the invention to provide an improved audio level switching feature for a multimedia telecommunications system.

It is also an object of the invention to provide an automatic gain control system which uses an algorithm which can calibrate the automatic gain control of all channels of a multimedia telecommunications system even in the presence of speech on the multimedia telecommunications system.

It is another object of the invention to provide an automatic gain control system which normalizes the power levels of the speech signals in all the channels of a multimedia telecommunications system to within a fixed experimental range, so that all the speech signals have the same average power level estimation.

It is a further object of the invention to provide an automatic gain control system which selects the appropriate gain for the audio input of each channel of a multimedia telecommunications system.

It is an additional object of the invention to provide an automatic gain control system which improves the hearing comfort of parties using a multimedia telecommunications system by correcting low sensitivity microphone problems and further correcting analog transport losses causing signal attenuation.

In accord with these objects which will be discussed in detail below, the audio processing unit (APU) of a multimedia multipoint server (MMS) runs an automatic gain control (AGC) algorithm. The AGC algorithm of the APU allows the APU to set the average power level of all the audio channels to the same value. The AGC algorithm also improves the voice activated switching performance as all the channels of a conference will have the same average power level when transmitting a speech-based audio signal and will not be affected by line noise. The AGC algorithm calibrates the average power of each channel to within an experimentally determined fixed range by modifying input gain, when necessary, and can activate, deactivate, and calibrate the gain function channel by channel. The AGC algorithm operates to bring the power level of the speech-based audio signal of every active channel to within the fixed range. The AGC algorithm allows the use of non-calibrated microphones, corrects for long distance signal attenuation, and provides an improved audio level reference for audio level, or voice activated, video switching.

The AGC algorithm is structured into two sections: calibration, and gain control. The calibration includes defining a noise threshold. Gain control includes three steps. First, a dynamic speech detection level is calculated. Second, with reference to the speech detection level, a determination is made as to whether an incoming audio signal is a speech-based audio signal. Finally, when the audio signal is determined to be of speech, a smoothed power estimation of the speech signal is calculated, and the gain on each channel is appropriately updated so that the power level of the speech signal is confined to a fixed experimental range such that a correct decision can be made when choosing a "loudest channel".

Additional objects and advantages of the invention will become apparent to those skilled in the art upon reference to the detailed description taken in conjunction with the provided figures.

DETAILED DESCRIPTION OF THE PREFERRED EMBODIMENTS

Figure 2:
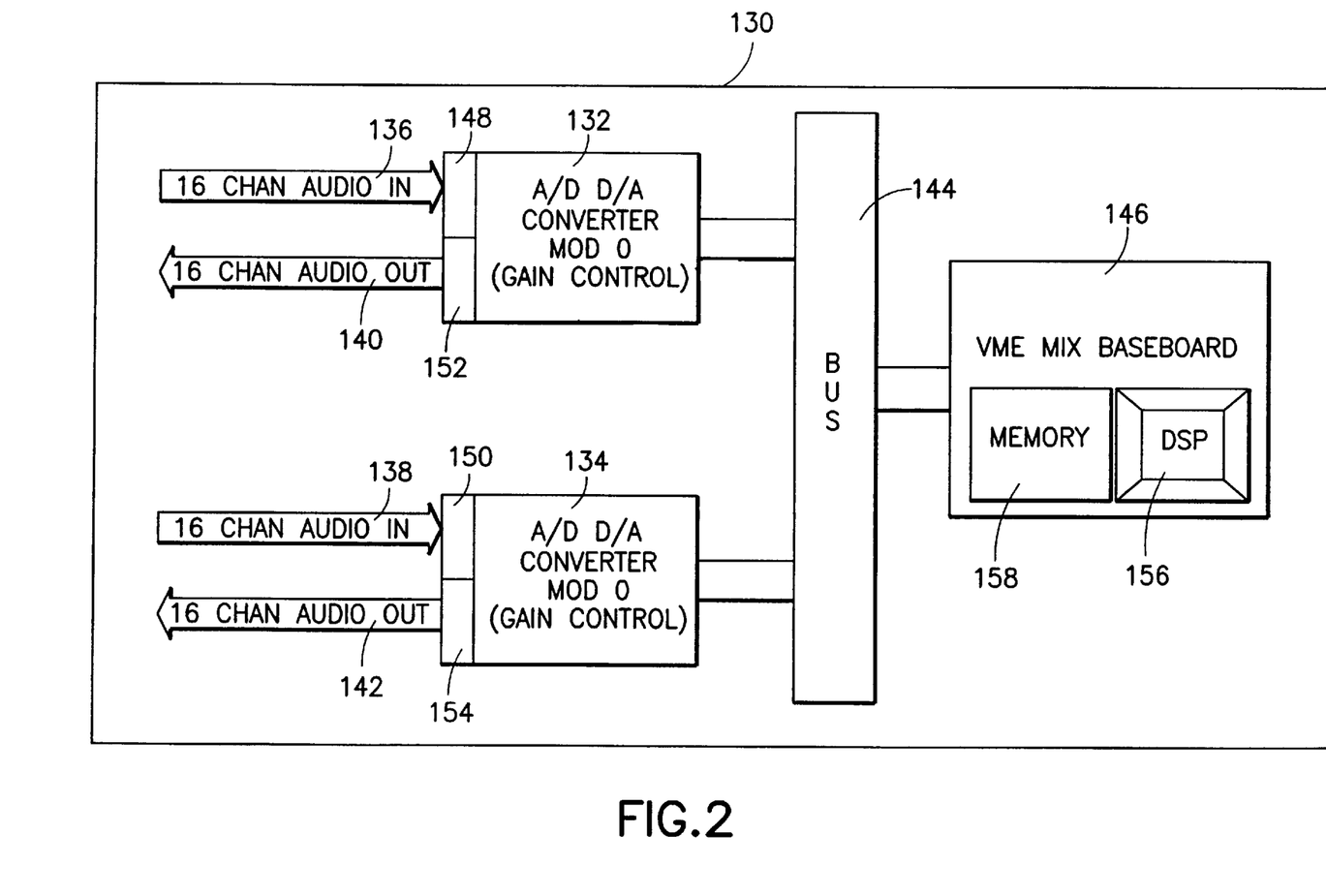
FIG. 2 is a schematic of the audio processing unit system of a multimedia conferencing system according to the invention.

Turning now to FIG. 2, the audio processing unit (APU) 130 of a multimedia conferencing system is shown. The APU 130 includes two sixteen bit analog-to-digital/digital-to-analog (A/D-D/A) converters 132, 134, each of which can accommodate sixteen incoming channels 136, 138 and sixteen outgoing channels 140, 142, a thirty-two bit bus 144 which can carry samples from thirty-two audio channels, and a VME baseboard 146 for processing. Each A/D-D/A converter 132, 134 is provided at its input with a programmable gain amplifier 148, 150 which preferably has a gain range of 0 to 22.5 dB and preferably has a resolution of 1.5 dB. Each A/D-D/A converter 132, 134 is also provided with a programmable attenuator 152, 154, preferably having a range of 0 to −94.5 dB, and also preferably at a resolution of 1.5 dB. Gain and attenuation of each incoming audio channel are thereby separately controllable. The VME baseboard includes a digital signal processor (DSP) 156, preferably a TMS 320C4x processor by Texas Instruments, for processing the incoming and outgoing audio channels, and a memory 158.

According to the invention, the VME baseboard 146 controls the gain and attenuation of the signals on the channels through an automatic gain control (AGC) algorithm which is executed by the DSP 156. The AGC algorithm is implemented in the interrupt service routine (ISR) of the DSP 156 and is done in parallel with the other audio processing tasks, such as audio mixing, power estimation, and loudest speaker detection. The frequency of the ISR is tied to a sampling clock on the DSP 156, and preferably occurs once every sixty-four samples of the audio signal by the DSP. The AGC algorithm may be activated or deactivated on a channel by channel basis.

In general, the AGC algorithm calibrates the power level of the signal on each channel on which the AGC algorithm is activated and updates the gain of each channel separately to bring the power levels of the channels within a single range, between an upper average power level (UAPL) and a lower average power level (LAPL). The UAPL and LAPL are experimentally determined, and are preferably located far enough apart from each other so as to not propagate instability and close enough such that each channel upon which the AGC algorithm is activated is provided with substantially the same power levels for audio signals carrying speech.

Figure 3:
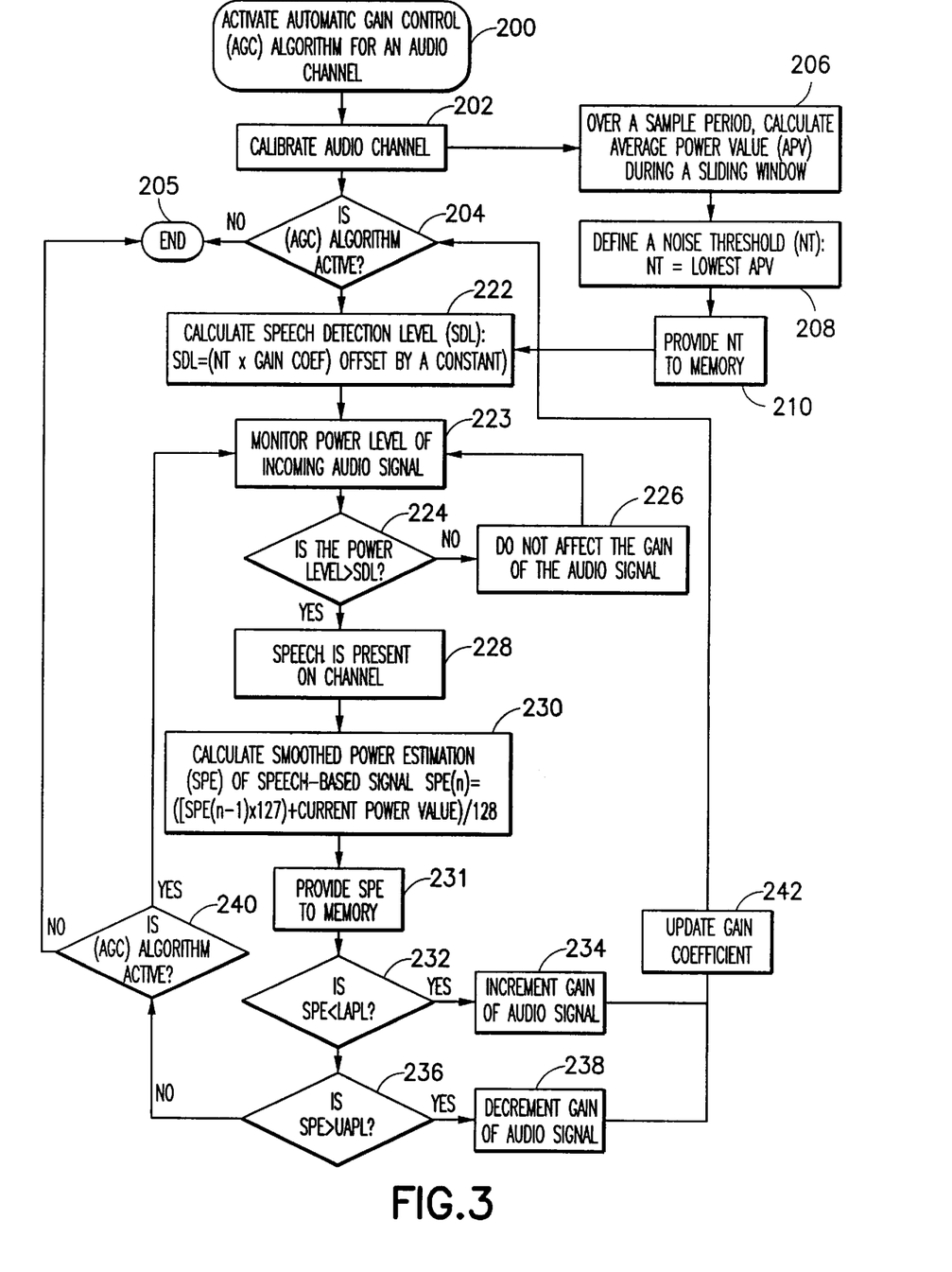
FIG. 3 is a flow diagram of the automatic gain control algorithm of the invention.

Turning to FIG. 3, when the AGC algorithm is activated at 200 on a channel, the channel is first calibrated at 202, and then the gain control is algorithmically updated on a continuous basis while the AGC is determined to be active at 204. The steps for calibration and gain control are described in detail below and briefly described as follows. The calibration step (202, 206–210) defines a noise threshold (NT) for the line noise of the audio channel. After calibration, gain control (222–242) includes first defining a speech detection level (SDL) (222) relative to the noise threshold and the gain applied to signal on the channel. Next, with reference to the speech detection level, an incoming audio signal is classified as either speech-based or non-speech-based (222–228) based on its power level. When the audio signal is determined to be of speech, a smoothed power estimation (SPE) of the speech-based signal is updated (230). Finally, based upon the smoothed power estimation of the speech-based signal, the gain on each signal is either incremented, decremented, or unchanged (231–242) so that the power level of the audio signals are initially moved towards and afterward confined to a fixed experimental range. The gain control steps repeat sequentially until the AGC algorithm for the channel is terminated at 205.

The calibration step 202 concerns finding a noise threshold (NT) of the line noise present in the audio signal. In order to define the NT, a sliding window (buffer) of 40 milliseconds is used through a two second sample of the power level of the audio signal at a 2 millisecond sampling rate. Each 40 millisecond window provides twenty power level samples. The twenty power level samples are averaged to calculate an average power value (APV) of the signal. At the end of the two second sample, the lowest APV is defined at 208 as the NT. The NT has been found to be a reliable estimate of the average noise power level of the signal. The NT is provided at 210 to the memory 158 on the VME baseboard 146. Calibration may be performed while the audio signal is carrying speech.

Figure 4:
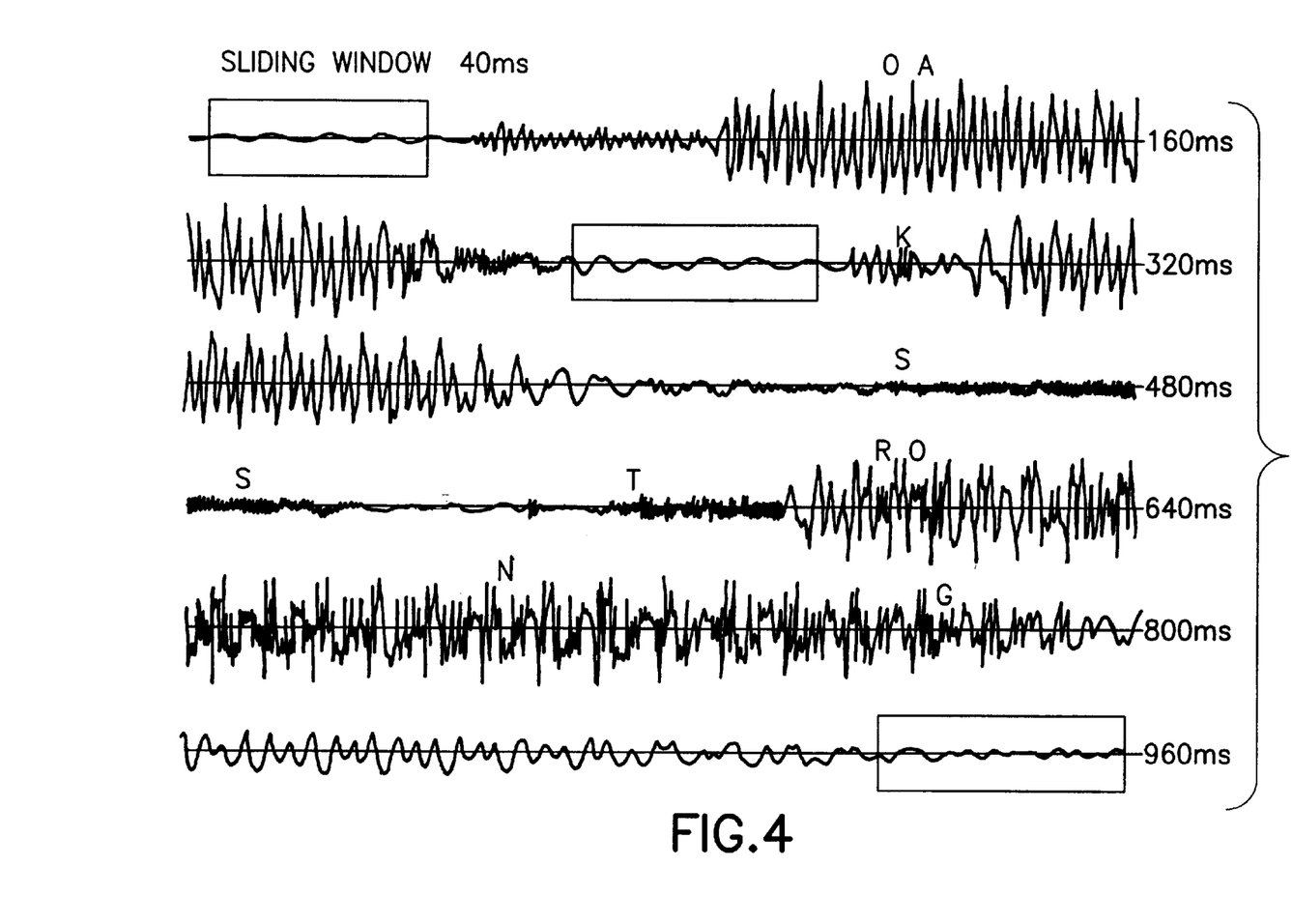
FIG. 4 is a signal waveform of an exemplar phrase, illustrating the determination of the noise threshold of an audio channel during speech over that channel according to the automatic gain control algorithm of the invention.

For example, with reference to FIG. 4, an exemplar speech signal waveform for the phrase "oak is strong" is shown. The phrase requires approximately one second to speak. As the forty millisecond second window moves through the spoken words, APVs are determined for each window. The lowest APV is then determined. In the example, the lowest APV corresponds to three separate highlighted windows in the 960 millisecond sample: one before the phrase has begun, one during the phrase, and one at the conclusion of the phrase. The lowest APV is then set to the NT and provided to memory, as described above, and the calibration portion of the AGC algorithm is complete.

Turning back to FIG. 3, after calibrating the audio channel, the DSP 156 moves to its gain control function. Thus at 222 the SDL is preferably calculated by multiplying the NT by a gain coefficient and offsetting the product of the NT and gain coefficient by a noise allowance constant. The offset is experimentally determined. The first time the SDL is calculated, the gain has not yet been adjusted on the channel. Therefore, the gain on the channel is set at a predetermined value, e.g., 1 corresponding to 0 dB. The SDL is a dynamic indicator (i.e., its value has the potential to change with each cycle of the algorithm) which determines whether speech, and not background noise (e.g., doors closing, chairs squeaking, whispering in the room in which the microphone feeding the audio channel is located) is present on the audio channel. As such, the SDL provides a filter relative to the NT for disregarding sounds which are not speech, even if those sounds provide an audio power level greater than the NT.

At 223, the power level of the incoming signal is monitored. If, at 224, it is determined that the audio signal power is less than the SDL, the audio signal is considered line noise or background noise, and the gain on the audio signal is not changed at 226 from its current level. The DSP 146 therefore continues at 223 to monitor the audio signal power level. However, if at 224 it is determined that the audio signal is greater than the SDL, the audio signal is declared at 228 to be carrying speech and, according to the preferred embodiment of the invention, the audio signal is filtered at 230 by a low pass filter to provide a smoothed power estimation (SPE) of speech-based audio. In the preferred embodiment, the SPE corresponds to an average of the last one-hundred twenty-eight power values identified as speech-related according to:

$$SPE(n)=([SPE(n-1)\times 127]+\text{current power value of the audio signal})/128,$$

wherein when n=1, SPE(n−1) is set to a predefined value, e.g., zero or the current value of the audio signal. The calculated value of SPE(n) is stored at 231 in memory 158 (FIG. 2), and becomes the value of SPE(n−1) on the subsequent cycle through the gain update routine. The value of SPE(n) will gradually increase and then stabilize if SPE was initialized to zero.

SPE(n) is compared to the lower average power value (LAPL) and the upper average power value (UAPL) to determine whether SPE(n) is within the experimentally determined acceptable range for power values. If, at 232, it is determined that SPE(n) is less than the lower average power level (LAPL), then the gain of the channel is incremented at 234 by some predetermined value, e.g., 1.5 dB. If, at 236, it is determined that SPE(n) is greater than the upper average power level (UAPL), then the gain is decremented at 238, by some predetermined value, e.g., 1.5 dB. If SPE(n) is within the range of the UAPL and LAPL, the gain on the channel is not updated. As long as the AGC algorithm is active (at 240), the gain update routine continues to monitor at 223 the power level of the audio signal. Otherwise, the AGC algorithm is terminated at 205.

When the audio signal has its gain updated at 234 or 238, the gain coefficient for calculating the SDL is also updated at 242 relative to the increment or decrement of the gain on the audio signal. Consequently, the SDL for any channel having its gain updated, is also updated at 222 using the new gain coefficient. For example, if the gain on a channel is increased at 234 by 1.5 dB, the gain coefficient for calculating the SDL becomes 1.19 (decibels being a logarithmic scale, and 1.5 being the logarithm of 1.19 multiplied by 20). Once the SDL is updated at 222, the DSP 156 continues to monitor at 223 the power level of the audio signal and the process is repeated; i.e., the power level of the audio signal is compared at 224 to SDL; if at 228 the signal is determined to contain speech, the SPE is updated at 230; the SPE is compared to the LAPL and UAPL at 232 and 236; the gain is either incremented at 234, decremented at 238, or unchanged; and the SDL is updated at 222 if the gain is amplified or attenuated. The resulting effect on the power level of an audio signal is shown in FIG. 5. The gain updating steps of the algorithm are repeated until the AGC algorithm is deactivated for the channel.

By applying the AGC algorithm to all active channels, all active channels will stabilize their power levels between UAPL and LAPL, preferably within a few seconds (e.g., four seconds). It will be appreciated that because the SPE is only updated when speech is carried on the audio signal (and not updated when the audio signal power level is less than the SDL), the SPE level is maintained within the bounds of the UAPL and LAPL even when the audio signal does not contain speech. It will also be appreciated that the size of the gain increment/decrement and the rate at which the gain coefficient is updated determines the rate at which the power level of an audio signal converges to within the bounds of the UAPL and LAPL. The gain coefficient step and/or the gain updating rate may be decreased such that the algorithm requires more time to bring the power level within the bounds of the UAPL and the LAPL, but that once within those bounds the power level of an audio signal has increased consistency. On the other hand, the gain coefficient step and/or gain updating rate may be also be increased such that the signal is first brought within the bounds of the UAPL and the LAPL more rapidly (e.g., in under four seconds), but the power of the audio will fluctuate more once within those bounds.

Once the power levels of all the audio signals on the active channels have stabilized between the UAPL and LAPL, the user of a multimedia telecommunications system who is speaking loudest is correctly chosen as the "loudest speaker", such that the other users in voice activated video switching mode can see the loudest speaker. As a result, issues regarding line noise, background noise, and microphone calibration are overcome.

It will be appreciated that the SDL may be alternatively calculated and the preferred method of calculation is experimentally determined according to a particular application. For example, the SDL may be calculated by offsetting the NT by a noise allowance constant and multiply the sum of the NT and noise allowance constant by the gain coefficient, or by multiplying the NT by both a noise allowance coefficient and the gain coefficient.

There have been described and illustrated a method of automatically updating the gain of an audio signal on a channel of a multimedia multipoint server. While a particular embodiment of the invention has been described, it is not intended that the invention be limited thereto, as it is intended that the invention be as broad in scope as the art will allow and that the specification be read likewise. Thus, while a Texas Instruments DSP has been disclosed for use in the audio processing unit, other brand DSPs may be used as well. Also, while a thirty-two channel APU is described, a system having fewer or greater number of channels can also be used. In addition, while a VME bus has been disclosed, it will be appreciated that buses operating according to other standards (e.g., ISA or PCI) may also be used. Furthermore, while it is preferable to compare the SPE to the LAPL and the UAPL to determine whether the gain should be updated on an audio signal, it will also be appreciated that the actual power level of the audio signal may be compared with the UAPL and the LAPL once it is determined that the audio signal contains speech, and that the step in the routine of the calculating the SPE may be eliminated. Also, while particular constants and coefficients have been disclosed, it will be recognized that other constants and coefficients can be used. For example, while the SPE is calculated to substantially stabilize after one-hundred twenty-eight calculations (based upon the use of 127 as a constant, and 128 as the denominator of the equation for calculating the SPE), other constants and denominators may be used. In addition, while certain values are provided to a memory on the VME baseboard, it will be appreciated that the values may be provided to one or more memories provided on the VME baseboard or elsewhere in the APU. Moreover, while the A/D-D/A converters are described as having programmable amplifiers and attenuators for adjusting the gain of an audio signal, i.e., changing the gain is implemented by hardware, it will be appreciated that gain amplification and attenuation may be implemented by software. Furthermore, while the AGC algorithm has been described with respect to a multimedia telecommunications system, it will be appreciated that the AGC algorithm may be used in other systems which include more than one audio signal and in which it is desired to equalize the power level of the audio signals. It will therefore be appreciated by those skilled in the art that yet other modifications could be made to the provided invention without deviating from its spirit and scope as so claimed.

We claim:

1. A method of automatically updating the gain applied to a plurality of audio signals on a plurality of audio channels to bring the speech power level of each of the audio signals within the bounds of an upper average power level and a lower average power level comprising:

for each audio signal on each audio channel,
 a) sensing the audio signal on the audio channel;
 b) calibrating the audio channel to determine an indication of a line noise level present on the audio channel; and
 c) regulating a gain applied to the audio signal by
  i) calculating a speech detection level as a function of the indication of the line noise level,
  ii) monitoring the power level of the audio signal,
  iii) determining whether the power level of the audio signal is greater than the speech detection level,
  iv) comparing a function of the power level of the audio signal to the upper average power level and to the lower average power level when the power level of the audio signal is greater than the speech detection level,
  v) changing the gain to an updated gain based on said comparing when the function of the power level of the audio signal is not within the bounds of the upper and lower average power levels,
  vi) recalculating said speech detection level as a function of the indication of the line noise level and the updated gain, and
  vii) repeating steps i) through vi) at least until the function of the power level of the audio signal is maintained within the bounds of the upper and lower average power levels.

2. A method according to claim 1, wherein:

the function of the power level is a speech power estimate of the audio signal.

3. A method according to claim 2, wherein:

the speech power estimate comprises a low pass filter.

4. A method according to claim 3, wherein:

said low pass filter is a power smoothing function calculated by multiplying the previous value of the power smoothing function by a constant to obtain a product, adding the current power level of the audio signal to said product to get a sum, and dividing said sum by a constant, wherein the previous value of the power smoothing function is set to a predetermined value the first time the power smoothing function is calculated.

5. A method according to claim 4, wherein:

said changing comprises increasing the gain when the speech power estimate is below the lower power level and decreasing the gain when the speech power estimate is above the upper power level.

6. A method according to claim 1, wherein:

said calculating the speech detection level includes multiplying the indication of the line noise level by a gain coefficient to result in a first product and offsetting the first product by a noise allowance constant.

7. A method according to claim 6, wherein:

said recalculating the speech detection level includes multiplying the indication of the line noise level by an updated gain coefficient to result in a second product and offsetting the second product by the noise allowance constant.

8. A method according to claim 1, wherein:

said calculating the speech detection level includes multiplying the indication of the line noise level by a noise allowance coefficient and by a gain coefficient.

9. A method according to claim 8, wherein:

said recalculating the speech detection level includes multiplying the indication of the line noise level by the noise allowance coefficient and by an updated gain coefficient.

10. A method according to claim 1, wherein:

said calculating the speech detection level includes offsetting the indication of the line noise level by a noise allowance constant to result in a sum and multiplying the sum by a gain coefficient.

11. A method according to claim 10, wherein:

said recalculating the speech detection level includes multiplying the sum by an updated gain coefficient.

12. A method according to claim 1, wherein:

said indication of the line noise level is calculated by sampling the audio signal for a predetermined period of time, and determining a lowest average power level during windows in said period of time.

13. A method according to claim 1, wherein:

the function of the power level is the power level.

14. A method according to claim 1, wherein:

said calibrating comprises

A) sampling the power level of the audio signal at a sampling rate to obtain a plurality of sample values, B) defining a time window incorporating some of the plurality of sample values, C) averaging the power levels of the sample values in the time window to find an average power level for the time window, D) sliding the time window to create new time windows and repeating steps B) and C) for each new time window to obtain an average power level for each new time window, and E) determining the lowest average power level for all of the time windows, wherein the lowest average power level is the indication of the line noise level.

15. A method of automatically updating the gain applied to an audio signal on an audio channel to bring the speech power level of the audio signal within the bounds of an upper average power level and a lower average power level, comprising:

a) sensing the audio signal on the audio channel;

b) calibrating the audio channel to determine an indication of a line noise level present on the audio channel, said calibrating comprising, i) sampling the power level of the audio signal at a sampling rate to obtain a plurality of sample values, ii) defining a time window incorporating some of the plurality of sample values, iii) averaging the power levels of the sample values in the time window to find an average power level for the time window, iv) sliding the time window to create new time windows and repeating steps ii) and iii) for each new time window to obtain an average power level for each new time window, and iv) determining the lowest average power level for all of the time windows, wherein the lowest average power level is the indication of the line noise level; and b) regulating a gain applied to the audio signal by i) calculating a speech detection level as a function of the indication of the line noise level, ii) monitoring the power level of the audio signal, iii) determining whether the power level of the audio signal is greater than the speech detection level, iv) comparing a function of the power level of the audio signal to the upper average power level and to the lower average power level when the power level of the audio signal is greater than the speech detection level, v) changing the gain to an updated gain based on said comparing when the function of the power level of the audio signal is not within the bounds of the upper and lower power levels, vi) recalculating said speech detection level as a function of the indication of the line noise level and the updated gain, and vii) repeating steps i) through vi) at least until the function of the power level of the audio signal is maintained within the bounds of the upper and lower power levels.

16. A system for automatically updating the gain applied to a plurality of audio signals on a plurality of audio channels to bring the speech power level of each of the audio signals within the bounds of an upper average power level and a lower average power level, comprising:

a) means for sensing the plurality of audio signals on the plurality of audio channels;

b) means for calibrating each audio signal on each audio channel to determine an indication of a line noise level present on the audio channel; and c) means for regulating a gain applied to each audio signal by i) calculating a speech detection level as a function of the indication of the line noise level, ii) monitoring the power level of the audio signal, iii) determining whether the power level of the audio signal is greater than the speech detection level, iv) comparing a function of the power level of the audio signal to the upper average power level and to the lower average power level when the power level of the audio signal is greater than the speech detection level, v) changing the gain to an updated gain based on said comparing when the function of the power level of the audio signal is not within the bounds of the upper and lower average power levels, vi) recalculating said speech detection level as a function of the indication of the line noise level and the updated gain, and vii) repeating steps i) through vi) at lest until the function of the power level of the audio signal is maintained within the bounds of the upper and lower average power levels.

17. A system according to claim 16, wherein:

said function of the power level is a speech power estimate of the audio signal which comprises a power smoothing function calculated by multiplying the previous value of the power smoothing function by a constant to obtain a product, adding the current power level of the audio signal to said product to get a sum, and dividing said sum by a constant, wherein the previous value of the power smoothing function is set to a predetermined value the first time the power smoothing function is calculated.

18. A system according to claim 17, wherein:

said gain is changed by increasing the gain when the speech power estimate is below the lower power level and decreasing the gain when the speech power estimate is above the upper power level.

19. A system according to claim 16, wherein:

said speech detection level is calculated by multiplying the indication of the line noise level by a gain coefficient to result in a first product and offsetting the first product by a noise allowance constant.

20. A system according to claim 16, wherein:

said means for calibrating, i) samples the power level of the audio signal at a sampling rate to obtain a plurality of sample values, ii) defines a time window incorporating some of the plurality of sample values, iii) averages the power levels of the sample values in the time window to find an average power level for the time window, iv) slides the time window to create new time windows and repeats steps ii) and iii) for each new time window to obtain an average power level for each new time window, and iv) determines the lowest average power level for all of the time windows, wherein the lowest average power level is the indication of the line noise level.

* * * * *